United States Patent
Kimme et al.

(10) Patent No.: US 11,213,859 B2
(45) Date of Patent: Jan. 4, 2022

(54) METHOD FOR CLASSIFYING LIGHT-EMITTING SEMICONDUCTOR COMPONENTS AND IMAGE SENSOR APPLICATION HAVING AN IMAGE SENSOR AND A SEMICONDUCTOR ELEMENT

(71) Applicant: OSRAM OLED GmbH, Regensburg (DE)

(72) Inventors: Felix Kimme, Stephanskirchen (DE); Peter Brick, Regensburg (DE)

(73) Assignee: OSRAM OLED GmbH, Regensburg (DE)

(*) Notice: Subject to any disclaimer, the term of this patent is extended or adjusted under 35 U.S.C. 154(b) by 976 days.

(21) Appl. No.: 15/129,406

(22) PCT Filed: Mar. 19, 2015

(86) PCT No.: PCT/EP2015/055808
§ 371 (c)(1),
(2) Date: Sep. 26, 2016

(87) PCT Pub. No.: WO2015/144562
PCT Pub. Date: Oct. 1, 2015

(65) Prior Publication Data
US 2017/0100751 A1  Apr. 13, 2017

(30) Foreign Application Priority Data
Mar. 26, 2014 (DE) ............ 10 2014 104 234.4

(51) Int. Cl.
*H01L 33/00* (2010.01)
*B07C 5/34* (2006.01)
(Continued)

(52) U.S. Cl.
CPC .......... *B07C 5/3416* (2013.01); *H01L 31/147* (2013.01); *H01L 33/00* (2013.01); *B07C 2301/0008* (2013.01); *H04N 5/2256* (2013.01)

(58) Field of Classification Search
CPC ..................... H01L 33/00; B07C 5/3416
(Continued)

(56) References Cited

U.S. PATENT DOCUMENTS 6,440,618 B1 * 8/2002 Slusarek ............ G03C 7/305
                                                         430/21
6,552,495 B1   4/2003 Chang
(Continued)

FOREIGN PATENT DOCUMENTS

CN        102308140 A      1/2012
DE     102012016675 A1     2/2014
(Continued)

OTHER PUBLICATIONS

Giorgianni, E. J., et al., "Digital Color Management", Encoding Solutions, 2nd Edition, Wiley, 2008, 42 pgs.
(Continued)

*Primary Examiner* — Charles A Fox
*Assistant Examiner* — Michael E Butler
(74) *Attorney, Agent, or Firm* — Arent Fox LLP

(57) ABSTRACT

The invention relates to a method for classifying a light-emitting semiconductor component (301) for an image sensor application, wherein the semiconductor component (301) is designed as a light source for an image sensor (302), comprising the following steps: providing the light-emitting semiconductor component (301); determining at least one of the following parameters of the light emitted with an emission spectrum by the light-emitting semiconductor component (301) during operation: $R=\int qR(\lambda)\cdot S(\lambda)d\lambda\cdot texp$, $G=\int qG(\lambda)\cdot S(\lambda)d\lambda\cdot texp$, $B=\int qB(\lambda)\cdot S(\lambda)d\lambda\cdot texp$, wherein $qR(\lambda)$,
(Continued)

Figure 1:
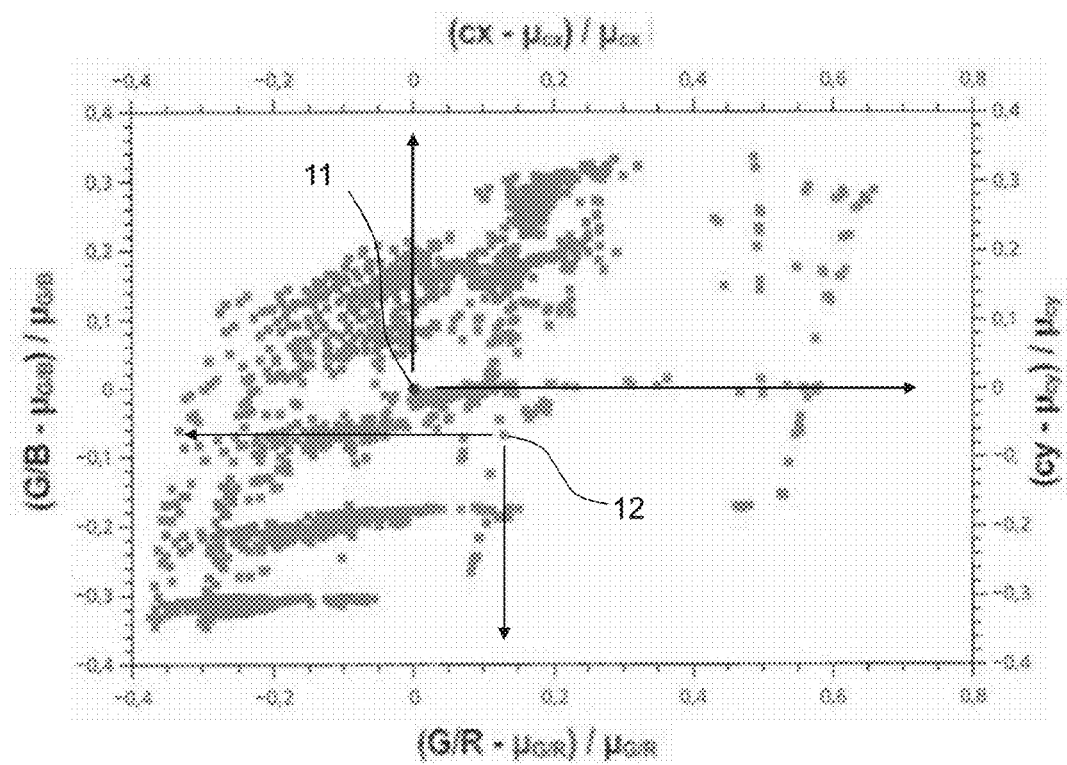

qG($\lambda$), and qB($\lambda$) are spectral sensitivities of a red, green, and blue color channel of the image sensor (302), S($\lambda$) is the emission spectrum of the light-emitting semiconductor component (301), texp is an exposure time, and $\lambda$ designates a wavelength; classifying the light-emitting semiconductor component (301) into a class from a group of classes, which are characterized by different value ranges of at least one parameter that depends on at least one of the parameters R, G, and B. The invention further relates to an image sensor application.

14 Claims, 3 Drawing Sheets

(51) Int. Cl.
*H01L 31/147* (2006.01)
*H04N 5/225* (2006.01)

(58) Field of Classification Search
USPC .......................................................... 209/582
See application file for complete search history.

(56) References Cited

U.S. PATENT DOCUMENTS

| | | | |
|---|---|---|---|
| 6,623,142 B1 * | 9/2003 | Lippmann | F21V 9/08 |
| | | | 359/888 |
| 6,677,959 B1 * | 1/2004 | James | G06T 5/008 |
| | | | 345/589 |
| 2003/0216151 A1 | 11/2003 | Kitano et al. | |
| 2008/0285268 A1 | 11/2008 | Oku et al. | |
| 2009/0021732 A1 | 1/2009 | Kolodin et al. | |
| 2009/0207604 A1 | 8/2009 | Robotham | |
| 2010/0061081 A1 | 3/2010 | Muschaweck et al. | |
| 2010/0189429 A1 | 7/2010 | Butterworth | |
| 2011/0157589 A1 | 6/2011 | Michel et al. | |
| 2012/0275147 A1 | 11/2012 | Roberts et al. | |
| 2013/0141725 A1 | 6/2013 | Yun | |

FOREIGN PATENT DOCUMENTS

| | | |
|---|---|---|
| DE | 102013203429 A1 | 8/2014 |
| KR | 1020130076068 A | 7/2013 |
| WO | WO-2010070120 A1 | 6/2010 |
| WO | 2012156860 A1 | 11/2012 |

OTHER PUBLICATIONS

Darwesh, M. et al., "Effects of the Source, Surface, and Sensor Couplings and Colorimetric of Laser Speckle Pattern on the Performance of Optical Imaging System", Laser Applications in Microelectronic and Optoelectronic Manufacturing (LAMOM) XVI, Proc. of SPIE vol. 7920, No. 1, 2011, pp. 1-21.

Vinay Kumar, S. et al., "Color Selection Algorithm Design for Smart Lighting Application", International Journal of Computer Science and information Technology and Security, vol. 4, No. 1, Feb. 2014, pp. 8-13.

Tanaka, M. et al., "Color Control of a Lighting System Using RGBW LEDs", Proc. of SPIE-IS&T, vol. 7866, 2011, pp. 78660W-1-78660W-9.

Kimme, F. et al., "Optimized Flash Light-Emitting Diode Spectra for Mobile Phone Cameras", Applied Optics, vol. 52, No. 36, Dec. 20, 2013, pp. 8779-8788.

Decision of Rejection of Feb. 19, 2019 in Chinese Application No. 201580016361.8.

Wikipedia, https://en.wikipedia.org/w/index.php?title=Rg_chromaticity&oldid=59717677, rg chromaticity, Feb. 26, 2014, pp. 1-6.

* cited by examiner

METHOD FOR CLASSIFYING LIGHT-EMITTING SEMICONDUCTOR COMPONENTS AND IMAGE SENSOR APPLICATION HAVING AN IMAGE SENSOR AND A SEMICONDUCTOR ELEMENT

A method for classifying light-emitting semiconductor components and image sensor application having an image sensor and a semiconductor component This patent application claims the priority of the German patent application 10 2014 104 234.4, the disclosure of which is hereby incorporated by reference.

A method for classifying light-emitting semiconductor components is provided. An image sensor application having an image sensor and a semiconductor component is also provided.

Classification methods are known in which light-emitting semiconductor components are categorized in stipulated chromaticity coordinate ranges of the CIE 1931 standard chromaticity diagram.

A problem addressed by at least some embodiments is that of providing a classification method by means of which a plurality of different light-emitting semiconductor components for image sensor applications can be categorized into classes. A further problem addressed by specific embodiments is to provide an image sensor application having an image sensor and a semiconductor component.

Such problems are solved by a method and a subject pursuant to the independent claims. Advantageous embodiments and developments of the subject and of the method are characterized in the dependent claims and are also clear from the following description and drawings.

Pursuant to at least one embodiment a method is implemented that is configured for classifying $\lambda$("binning") a light-emitting semiconductor component, i.e. for categorizing the light-emitting semiconductor component in a class, also designated as "bin", from a group of classes. Said group of classes can be characterized by at least one, i.e. one or more, parameters. That means that each class of the group of classes is characterized by the respective value range of the one or more parameters. All semiconductor components for which the characterizing parameter or parameters are determined are assigned to the class corresponding to the value range. In other words, the at least one classifying parameter provided in the method described herein for the light-emitting semiconductor component to be classified is determined and compared with the value ranges of the individual classes, thus allowing the class to be determined in the value range or value ranges of which the one or more parameters determined for the light-emitting semiconductor falls.

In particular, the light-emitting semiconductor component can be provided for an image sensor application and be set up as light source for an image sensor. That may mean that the surrounding area to be recorded by the image sensor can be brightened by the semiconductor component during operation of the image sensor application, in the event of too little ambient brightness, for example.

Pursuant to at least one further embodiment, an image sensor application has an image sensor and a semiconductor component, wherein the method described herein is used for selecting the semiconductor component.

The embodiments and features described previously and in the following apply equally to the method and to the image sensor application.

Pursuant to a further embodiment, a light-emitting semiconductor component is provided. Said light-emitting semiconductor component can, for example, comprise or consist of at least one or more light-emitting semiconductor chips, which can be based on an arsenide, phosphide and/or nitride compound semiconductor material system. For example, the light-emitting semiconductor component can comprise or consist of one or more of the following components: a laser diode, a laser diode chip, a light diode, a light diode chip. Furthermore, the semiconductor component can comprise a wavelength conversion substance, which converts at least part of the light emitted by a light-emitting semiconductor chip during operation into light with another wavelength, so that the light-emitting semiconductor component can preferably emit a mixed-color light. Additionally or alternatively, the light-emitting semiconductor component can also comprise at least two light-emitting semiconductor chips, which emit light in different wavelength ranges, in order to generate mixed-color light. Additionally or alternatively, the light-emitting semiconductor component can also comprise at least one organic light-emitting component, in particular at least one organic light-emitting diode (OLED), or be designed as such. Specific embodiments of light-emitting semiconductor chips as well as combinations of differently-colored light-emitting semiconductor chips having wavelength conversion substances and organic light-emitting components for forming a light-emitting semiconductor component are known to a person skilled in the art and are thus not further explained herein.

Pursuant to a further embodiment, the light-emitting semiconductor component emits light with an $S(\lambda)$ emission spectrum during operation. The emission spectrum that is determinable by one or more light-emitting semiconductor chips and, if need be, one or more wavelength conversion substances, can preferably comprise spectral components in the event of a plurality of different wavelengths $\lambda$, and therefore the light emitted by the light-emitting semiconductor component is mixed-colored light. In particular, said mixed-colored light can be white light, warm-white or cold-white light, for instance.

Here and in the following, "light" can in particular designate electromagnetic radiation with one or more wavelengths or wavelength ranges from an ultraviolet to infrared spectral range. In particular, light can be visible light and can comprise wavelengths or wavelength ranges from a visible spectral range of greater than or equal to 350 nm, greater than or equal to 380 nm, less than or equal to 800 nm or less than or equal to 780 nm. Visible light can, for example, be characterized by the color location thereof with cx- and cy-chromaticity coordinates pursuant to the so-called CIE 1931 chromaticity diagram, or CIE standard chromaticity diagram, known to a person skilled in the art.

Designated as white light or light with a white luminous impression or color impression, here and in the following, can be light with a color location corresponding to the color location of a Planckian black body radiator, or deviating by less than 0.23 and preferably by less than 0.07 in cx and/or cy chromaticity coordinates from the color location of a Planckian black body radiator in the CIE standard chromaticity diagram.

Furthermore, here and in the following, "warm-white" can designate a luminous impression having a color temperature of less than or equal to 5500 K, which can also be designated as "neutral white", or less than or equal to 4500 K or less than or equal to 3500 K. Furthermore, a color temperature of less than or equal to one of the preceding values and greater than or equal to 1200 K and more preferably greater than or equal to 2500 K can be designated as warm white color temperature. Here and in the following, "cold-white" can designate a white luminous impression having a color temperature of greater than 5500 K. The term "color temperature", here and in the following, can designate the color temperature of a Planckian black body radiator or also the so-called correlated color temperature known to a person skilled in the art in the event of a white luminous impression in the above-described sense, which can be characterized by chromaticity coordinates that deviate from the chromaticity coordinates of a Planckian blackbody radiator.

Pursuant to a further embodiment, the method for classifying the light-emitting semiconductor component is based on the sensitivity of the image sensor for the image sensor application. In particular, the image sensor can be a multi-colored sensor, i.e. a sensor having a plurality of color channels for accommodating a plurality of colors. In particular, the image sensor can, for example, comprise a red, a green and a blue color channel. Each of the color channels can, for example, be formed by a plurality of image sensor elements, in the form of sensor pixels of the image sensor, for instance. For example, the image sensor can be a CCD (charge-coupled device) sensor or a CMOS (complementary metal oxide semiconductor) sensor. The detectable spectral ranges of the individual color channels can, for example, be specified by appropriate color filters. Depending on the amount of incidental light in each case, the image sensor elements can generate reception signal values, which are preferably digital values that are generated by an analog-to-digital conversion of analogous reception signal values of the image sensor elements. Such digital values can also be designated as "code values" (CV).

Pursuant to a further embodiment, the image sensor has a spectral sensitivity $q_R(\lambda)$ of a red color channel, $q_G(\lambda)$ of a green color channel and $q_B(\lambda)$ of a blue color channel. The spectral sensitivities of the color channels of the image sensor can, for example, be specified in advance or be known from manufacturer specifications. The physical unit of the spectral sensitivities can, for example, be CV/(W/sr/m²/nm)/$t_{exp}$, wherein $t_{exp}$ is an exposure time and (W/sr/m²/nm) is the spectral radiation density measured by the image sensor. The code value CV, i.e. the reception signal value depending on the amount of incidental light, is dependent upon the exposure time $t_{exp}$.

Pursuant to a further embodiment, at least one or more of the following parameters of the light emitted during operation with the emission spectrum $S(\lambda)$ by the light-emitting semiconductor component is determined with the emission spectrum of the light-emitting semiconductor component and the spectral sensitivities $q_R(\lambda)$, $q_G(\lambda)$ and $q_B(\lambda)$ of the red, green and blue color channels of the image sensor:

$$R=\int q_R(\lambda) \cdot S(\lambda) d\lambda \cdot t_{exp},$$

$$G=\int q_G(\lambda) \cdot S(\lambda) d\lambda \cdot t_{exp},$$

$$B=\int q_B(\lambda) \cdot S(\lambda) d\lambda \cdot t_{exp},$$

With respect to the aforementioned units of the spectral sensitivities of the image sensor, the spectral radiation density should be used when determining the parameters R, G and B as emission spectrum $S(\lambda)$. In addition, other definitions of the spectral sensitivities and of the emission spectrum are also possible.

Pursuant to a further embodiment, the light-emitting semiconductor component is categorized in a class from a group of classes, which are characterized by different value ranges of at least one parameter that depends on at least one of the parameters R, G and B. In other words, the classes in which the light-emitting semiconductor component can be categorized are characterized by one or more parameters, which each depend on one or more of the parameters R, G and B. After determining one or more of the parameters R, G and B for the light-emitting semiconductor component to be categorized, the latter can thus be assigned to a value range of the at least one characterizing parameter and thus to a class.

The values R, G and B define the image sensor color space. The assessment and the categorization of the light-emitting semiconductor component thus ensue in the image sensor color space in the method described herein. As the absolute spectral radiation density is standardized by $t_{exp}$, the binning advantageously ensues in a relative, standardized image sensor color space.

The method described herein is based on the following considerations. Light-emitting semiconductor components such as light diode chips, for instance, are currently used as illumination sources for image pick-up processes. Thus, for example, light-emitting semiconductor components containing light diode chips are used as flash light sources in mobile phones. For instance, individual semiconductor components or even pairs of semiconductor components with the same emission spectrum are used in this regard. As an alternative, two or more semiconductor components with different emission spectrums are also used, in order to adjust the resulting color location to the ambient light by mixing the emission spectrums. The semiconductor components are categorized into various classes for pre-selection. In known methods one or more of the following photometric parameters are usually drawn upon for a corresponding categorization: brightness (for example in lumen or candela), color location (for example cx/cy, u'/v', correlated color temperature CCT, peak wavelength, dominant wavelength), operating voltage.

However, an image sensor does not usually just record the light of the illumination source, i.e. of one of more semiconductor components, for instance, when picking up an image; instead it also records a portion of the ambient light. Thus, an identical color location pursuant to the CIE standard chromaticity diagram, also designated as XYZ color space, or an identical color temperature for the two types of light, i.e. for the light of the illumination source and the ambient light, is typically selected in known methods. However, it can be seen that different raw data values for an image sensor result due to the different spectrums of the two types of light.

Furthermore, various light-emitting semiconductor components with different emission spectrums can still have identical standard color values in the XYZ color space and thus be assigned to an identical class in a binning process based on a photometric variable. However, due to the different emission spectrums, an illumination with the various light-emitting semiconductor components in a plurality of similar image sensor applications results in different raw data values for each individual image sensor of the individual image sensor applications, which would require an adjustment of the white balance for each semiconductor component. Such an adjustment of the white balance is, however, preferably avoided, as each image sensor application would otherwise have to be separately calibrated.

As, for example, a white balance is implemented by an image pick-up device in the sensor color space in which, as described above, different light spectrums can lead to different chromaticity coordinates despite identical standard color values in the XYZ color space, which in turn leads to different raw data values for the image sensor, the classification of the light-emitting semiconductor components in the present method is advantageously not implemented by drawing upon one or more of the above-stated photometric parameters. Instead, an assessment and a classification are implemented in the sensor color space in the method described herein.

Pursuant to another embodiment, classification ensues in dependence upon a linear combination of the parameters R, G and B. The categorization of the light-emitting semiconductor component in a class from a group of classes characterized by different value ranges of at least one parameter, can thus also be dependent upon at least one linear combination of two or three of the parameters R, G and B. To this end, a linear transformation of the parameters R, G and B into parameters R*, G*, B* can ensue with $$\begin{pmatrix} R^* \\ G^* \\ B^* \end{pmatrix} = \begin{pmatrix} a_1 & a_2 & a_3 \\ a_4 & a_5 & a_6 \\ a_7 & a_8 & a_9 \end{pmatrix} \begin{pmatrix} R \\ G \\ B \end{pmatrix}$$

wherein $a_1, \ldots, a_9$ are factors to be selected appropriately.

Pursuant to a further embodiment, the light-emitting semiconductor component is categorized in a class from a group of classes characterized by the respective value ranges of the parameters rg1=R/(R+G+B) and/or bg1=B/(R+G+B).

Pursuant to a further embodiment, the light-emitting semiconductor component is categorized in a class from a group of classes characterized by the respective value ranges of the parameters rg2=G/R and/or bg2=G/B.

Pursuant to a further embodiment, the light-emitting semiconductor component is categorized in a class from a group of classes characterized by the respective value ranges of the parameters rg3=R/G and/or bg3=B/G.

The parameters rgX and bgX with X=1, 2 or 3 have the advantage that the categorization ensues in a relative, standardized image sensor color space, as the previously described parameters rgX and bgX are independent of the exposure time $t_{exp}$.

The parameters rgX and bgX with X=1, 2 or 3 can also be formed by corresponding combinations of the parameters R*, G* and B* obtainable by the above-described linear transformation. In particular, it is also possible in this regard to restrict the production scattering to one of the parameters rgX and bgX due to the described transformation, and therefore the classification can be implemented in a one-dimensional manner.

Pursuant to another embodiment, the image sensor application is an application in which an electronic device with an image sensor picks up individual images or image sequences. Accordingly, the image sensor application can be selected from one of the following applications: camera, for example video camera or photographic apparatus, medical imaging device. Accordingly, the image sensor can form part of a video camera, a photographic apparatus, a mobile telephone or a medical imaging device. The light-emitting semiconductor component can form part of a video camera, a photographic apparatus, a stadium lighting system, a stage lighting system, a studio lighting system or a medical imaging device.

Pursuant to another embodiment, the class in which the light-emitting semiconductor component is categorized, is characterized by rgX values and bgX values with X=1, 2 or 3, which correspond to the corresponding rgX value and bgX value of sunlight or of light according to a standard light type A or D or of light of a Planckian emitter. Various categories of the standard light type D, for example D50, D55, D65, D75 and D93, are known to a person skilled in the art. Should the categorization ensue in a class with a minimal scattering around such a target value, the adjustment of a white balance algorithm may be omitted. A reproducible white balance may take place in identical color locations in the image sensor color space.

Pursuant to another embodiment, the value ranges of the parameters for categorizing the light-emitting semiconductor component, i.e. in particular the above-stated parameters rgX and bgX with X=1, 2 or 3, are defined by a target value and a stipulated deviation from such value. The deviation from the target value can, for example, be less than or equal to 20%, less than or equal to 15%, less than or equal to 10%, less than or equal to 5% or less than or equal to 1%.

Pursuant to a further embodiment, the image sensor application has at least two semiconductor components with different characterizing parameters, i.e. in particular with different rgX values and bgX values with X=1, 2 or 3. In particular, the semiconductor components can also be from different classes. In a color space defined by the corresponding parameters the parameter values of the two semiconductor components form a line that intersects the Planckian black body curve twice. Should more than two different light-emitting semiconductor components be used, the latter form a polygon in the corresponding color space, which includes part of the Planckian black body curve. When applying the image sensor, this allows tunable mixed spectrums to be achieved by a targeted adjustment of the relative intensity component of the light-emitting semiconductor components, which, for example, can be adapted to a plurality of ambient light types.

Further advantages, advantageous embodiments and developments result from the embodiments described in conjunction with the figures in the following.

Figure 2:
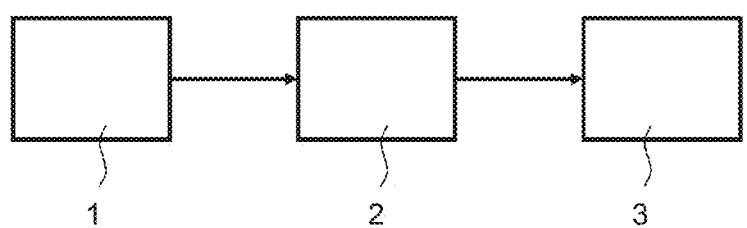
Figure 3A:
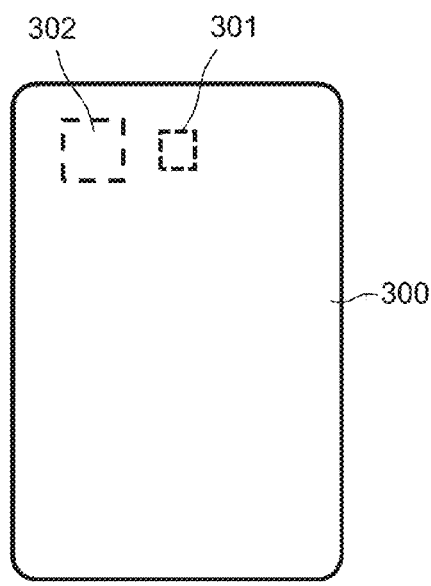
Figure 3B:
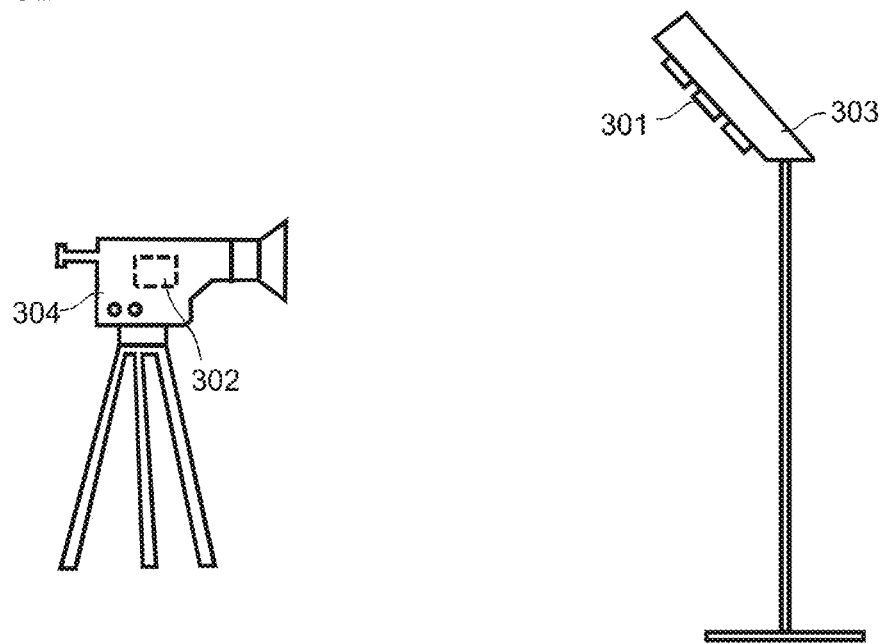
Figure 4:
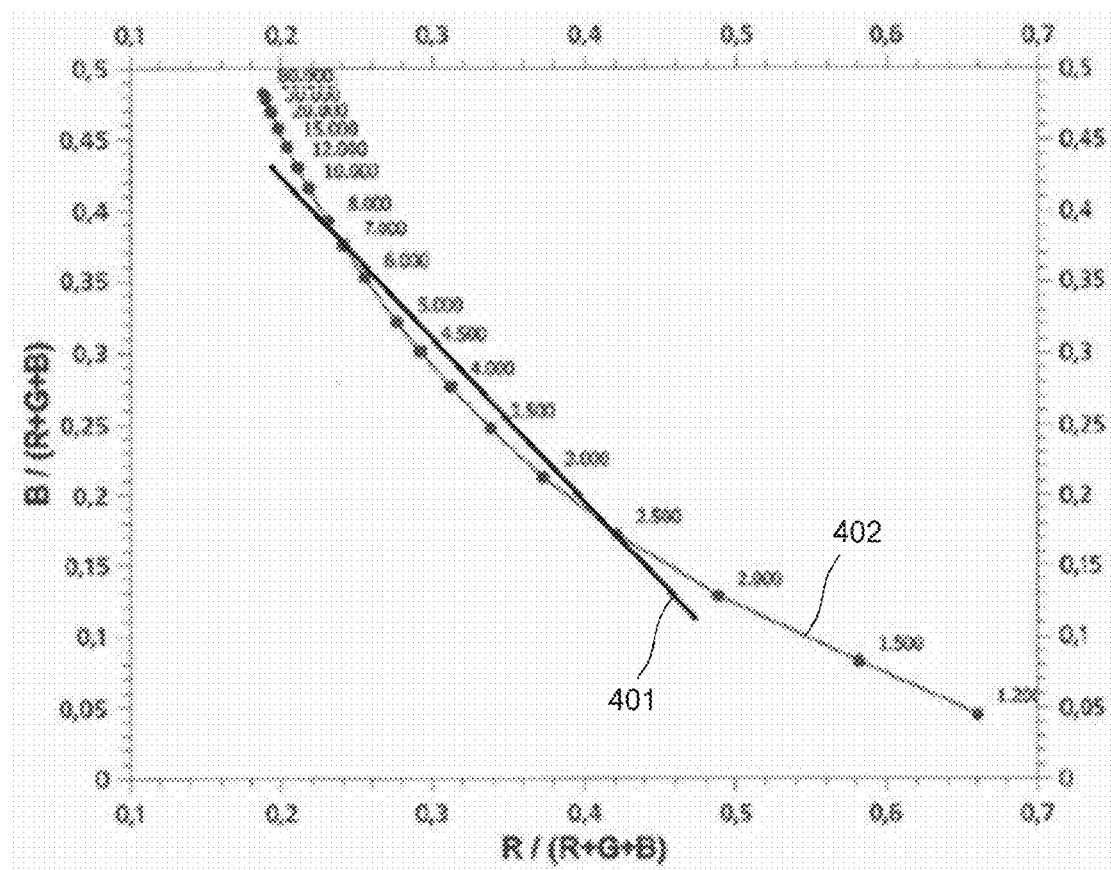

Shown in:

FIG. 1 is a simulation of color locations of various light-emitting semiconductor components, FIG. 2 is a schematic diagram of a method for classifying a light-emitting semiconductor component pursuant to an exemplary embodiment, FIGS. 3A and 3B are image sensor applications pursuant to further exemplary embodiments and FIG. 4 a chromaticity diagram with color locations of light-emitting semiconductor components pursuant to a further exemplary embodiment.

Identical, similar or seemingly identical elements can be provided with the same reference signs in the exemplary embodiments and illustrations. The elements shown and the size ratios thereof among each other should not be viewed as true-to-scale; instead individual elements, such as layers, parts, components and areas, for example, can be shown exaggeratedly large for the sake of better representation and/or for the sake of better understanding.

As described above in the general section, various light-emitting semiconductor components can comprise different emission spectrums but still have identical standard color values in the CIE standard chromaticity diagram. However, the color locations of the different emission spectrums in the color space of an image sensor can sometimes significantly differ from each other. That is due to the fact that the CIE standard chromaticity diagram is based on the human eye and the sensitivity thereof, from which the sensitivity of the image sensor deviates, and therefore different spectral components of the emission spectrum have differing degrees of weighting in the two color spaces. FIG. 1 shows a simulation for the color locations of a plurality of light-emitting semiconductor components with different emission spectrums in the XYZ color space, i.e. in the CIE standard chromaticity diagram, as well as in the image sensor chromaticity diagram. The upper horizontal and the right vertical axes designate the relative deviation of the chromaticity coordinates cx, cy from a mean value of $\mu_{cx}$, $\mu_{cy}$ of the entirety of all simulated semiconductor components in the XYZ color space, whereas the lower horizontal and left vertical axes designate the relative deviation of corresponding chromaticity coordinates from corresponding mean values in the image sensor color space. The axial assignment in the diagram is also indicated by the arrows.

The emission spectrums of the different light-emitting semiconductor components are simulated in such a way that they may be varied but still all result in the same color location in the XYZ color space. Thus, only one point 11 (filled-in circle) is recognizable in the diagram shown, which represents the overlapping color locations in the XYZ color space. Conversely, a plurality of different chromaticity coordinates results from the different emission spectrums in the image sensor color space and thus a cloud of points (filled-in quadrats) of which point 12 is exemplarily designated by a reference numeral.

Different light-emitting semiconductor components, i.e. semiconductor components with different emission spectrums having the same chromaticity coordinates in the XYZ color space can thus form a large cloud of different color locations in the image sensor color space, and therefore each of the light-emitting semiconductor components can lead to different raw data values for the image sensor.

FIG. 2 describes a method for classifying a light-emitting semiconductor component for an image sensor application, wherein the semiconductor component is configured as light source for an image sensor, said method taking into account the effect shown in FIG. 1 and implementing a classification in the color space of the image sensor. To this end, a light-emitting semiconductor component is provided in a first step 1. The light-emitting semiconductor component, which can be designed pursuant to the description in the general section and can comprise one or more light-emitting semiconductor chips in combination with one or more wavelength conversion substances, if need be, has an emission spectrum $S(\lambda)$.

In a further method step 2, at least one of the following parameters of the light emitted during operation with the emission spectrum $S(\lambda)$ by the light-emitting semiconductor component is determined:

$$R = \int q_R(\lambda) \cdot S(\lambda) d\lambda \cdot t_{exp},$$

$$G = \int q_G(\lambda) \cdot S(\lambda) d\lambda \cdot t_{exp},$$

$$B = \int q_B(\lambda) \cdot S(\lambda) d\lambda \cdot t_{exp},$$

In this respect, $q_R(\lambda)$, $q_G(\lambda)$ and $q_B(\lambda)$ are the spectral sensitivities of a red, green and blue color channel of the image sensor, which are known by prior determination of from manufacturer specifications. The spectral sensitivities comprise, for example, the physical unit $CV/(W/sr/m^2/nm)/t_{exp}$, wherein the "code value CV is dependent upon the irradiated amount of light and the exposure time $t_{exp}$. Accordingly, the emission spectrum $S(\lambda)$ is the spectral density. The integration ensues via a wavelength range containing all the relevant wavelengths contained in the spectral sensitivities and in the emission spectrum $S(\lambda)$, i.e. via a wavelength range in the visible spectral range of 350 nm to 800 nm or from 380 nm to 750 nm, for example. The R, G and B values thus determined define the image sensor color space.

The emission spectrum can, for example, be specified in advance or be known from manufacturer specifications. An alternative possibility is the use of a measurement device which, for example, takes into account the color channels of the image sensor and emits the latter pursuant to the previously stated determination of the parameters R, G and B.

The image sensor can, for example, be a CCD sensor or a CMOS sensor having a plurality of image sensor elements in the form of sensor pixels. The individual color channels can each be formed by part of the image sensor elements with corresponding color filters.

In a further (method) step 3, the light-emitting semiconductor component is categorized in a class among a group of classes, which are characterized by various value ranges of at least one parameter that depend upon at least one of the parameters R, G and B. Thus, at least one of the parameters R, G and B is taken into account in the classification. The individual classes are characterized by value ranges, which can be defined by a target value and a deviation therefrom. The relative deviation from the target value in the value range of each class can, for example, be less than or equal to 20%. Furthermore, more minimal deviations are also possible, as described above in the general section.

It is particularly advantageous if the classification ensues in a relative, standardized image sensor color space defined by parameters, which are not dependent on the exposure time $t_{exp}$. For example, in step 3 the light-emitting component can be categorized in a class from a group of classes characterized by the respective value ranges of the parameters rgX and/or bgX. In this respect, X can be=1, 2 or 3.

– X=1: $rg1=R/(R+G+B), bg1=B/(R+G+B)$,

– X=2: $rg2=G/R, bg2=G/B$,

– X=3: $rg3=R/G, bg3=B/G$.

One or more of the light-emitting semiconductor components categorized in classes by the previously described method can be used for image sensor applications in which images or image sequences are picked up by means of an image sensor.

FIG. 3a shows an exemplary embodiment of an image sensor application formed by a camera in a mobile telephone 300. As indicated by the dashed line, said mobile telephone 300 comprises at least one light-emitting semiconductor component 301 and an image sensor 302 and is provided and configured for picking up both individual images and image sequences. The mobile telephone 300 represents a plurality of mobile telephones, which preferably all comprise one or more light-emitting semiconductor components 301, which are selected from the same class or the same classes pursuant to the previously described method. This advantageously allows the emission spectrums of the light-emitting semiconductor components 301 in each mobile telephone 300 in the respective image sensor 302 to substantially achieve the identical raw data in the individual color channels, thus allowing a uniform adjustment of the white balance algorithm even in the event of a plurality of mobile telephones, and therefore removes the need for every mobile telephone produced to be separately calibrated.

Alternatively to the mobile telephone 300 shown, the image sensor application can, for example, also be a video camera or a photographic appliance or a medical imaging device.

FIG. 3B shows a further embodiment of an image sensor application configured for picking up images or image sequences in a stadium, on a stage or in a studio and having a stadium, stage or studio lighting system. The lighting 303, which can be formed by one or more spotlights or by a floodlight system, for example, and which comprises a plurality of light-emitting semiconductor components 301, allows a scene to be illuminated that can be picked up by means of the camera 304. Said camera 304 has an image sensor 302. As described in conjunction with the preceding embodiment, a method pursuant to the preceding description is also used for selecting the light-emitting semiconductor components 301 during the illuminating application of the embodiment of FIG. 3B.

In particular, for example, it can be advantageous to use light-emitting semiconductor components 301 in the previously described image sensor applications, the classifying parameters of which, in particular the rgX and bgX values thereof, correspond to the sun or an equivalent ambient light according to a standard illuminant A or D or a Planckian emitter. In the event of minimal scattering around suitable target values and a corresponding classification, the adjustment of the white balance algorithm can possibly be omitted. In particular, a reproducible white balance can take place in the event of identical color locations in the image sensor color space.

Should a plurality of light-emitting semiconductor components with different chromaticity coordinates originating from different classes of the previously described method be used, including a plurality of light-emitting semiconductor components, for example, in the event of two light-emitting semiconductor components the latter thus form a line 401 in the image sensor space, which intersects the Planckian black body curve twice, as shown in FIG. 4. In the event of more than two light-emitting semiconductor components with different emission spectrums being used, the latter form a polygon in the image sensor color space, which includes part of the Planckian black body curve. The varied light-emitting semiconductor components allow different mixed spectrums for the image sensor application to be generated, thus in turn allowing mixed spectrums, which are adjusted to a plurality of ambient light types, to be generated by an adjustment of the resulting rgX and bgX values.

The exemplary embodiments described in conjunction with the illustrations can comprise further or alternative features pursuant to the description in the general section.

The description on the basis of the exemplary embodiments does not limit the invention thereto. Instead, the invention comprises every new feature as well as every combination of features, which in particular includes every combination of features in the claims, even if such claim or such combination is not itself explicitly stated in the claims or exemplary embodiments.

The invention claimed is:

1. A method for classifying a light-emitting semiconductor component for an image sensor application, wherein the light-emitting semiconductor component is configured as a light source for an image sensor, comprising:
   providing the light-emitting semiconductor component comprising at least two light-emitting semiconductor chips;
   determining at least one of R, G, or B of a light emitted during operation with an emission spectrum by the light-emitting semiconductor component;

wherein $R = \int q_R(\lambda) \cdot S(\lambda) d\lambda \cdot t_{exp}$;

wherein $G = \int q_G(\lambda) \cdot S(\lambda) d\lambda \cdot t_{exp}$;

wherein $B = \int q_B(\lambda) \cdot S(\lambda) d\lambda \cdot t_{exp}$;

wherein $q_R(\lambda)$, $q_G(\lambda)$ and $q_B(\lambda)$ are spectral sensitivities of a red, green, and blue color channel of the image sensor, $S(\lambda)$ is the emission spectrum of the light-emitting semiconductor component, $t_{exp}$ is an exposure time, and $\lambda$ designates a wavelength;
   categorizing the light-emitting semiconductor component in a class from a group of classes which are characterized by different value ranges of at least one parameter that depends on at least one of R, G, or B;
   selecting the light-emitting semiconductor component for use with one or more other light-emitting semiconductor components having a same class as the class of the light-emitting semiconductor component; and
   illuminating the light source based on the selecting.

2. The method according to claim 1, wherein the light-emitting semiconductor component is categorized in the class from the group of classes which are characterized by respective value ranges of parameters:

$rg1 = R/(R+G+B)$, or $bg1 = B/(R+G+B)$, or both.

3. The method according to claim 1, wherein the light-emitting semiconductor component is categorized in the class from the group of classes which are characterized by respective value ranges of parameters:

$rg2 = G/R$, or $bg2 = G/B$, or both.

4. The method according to claim 1, wherein the light-emitting semiconductor component is categorized in the class from the group of classes which are characterized by respective value ranges of parameters:

$rg3 = G/R$, or $bg3 = G/B$, or both.

5. The method according to claim 2, wherein the class in which the light-emitting semiconductor component is categorized is characterized by rg1 and bg1 values which correspond to corresponding rg1 and bg1 values of sunlight or of light according to a standard illuminant A or D or light of a Planckian emitter.

6. The method according to claim 1, wherein the image sensor forms part of a video camera, a photographic apparatus, a mobile telephone, or a medical imaging device.

7. The method according to claim 1, wherein the light-emitting semiconductor component forms part of a video camera, a photographic apparatus, a mobile phone, a stadium lighting system, a stage lighting system, a studio lighting system, or a medical imaging device.

8. The method according to claim 1, wherein the light-emitting semiconductor component emits white light during operation.

9. The method according to claim 1, wherein the image sensor is a CCD sensor or a CMOS sensor.

10. An apparatus comprising:
    an image sensor; and
    a light-emitting semiconductor component which is configured as a light source for the image sensor and comprises at least two light-emitting semiconductor chips,
    wherein the light-emitting semiconductor component is selected by:
    determining at least one of R, G, or B of a light emitted during operation with an emission spectrum by the light-emitting semiconductor component;

wherein $R = \int q_R(\lambda) \cdot S(\lambda) d\lambda \cdot t_{exp}$;

wherein $G = \int q_G(\lambda) \cdot S(\lambda) d\lambda \cdot t_{exp}$;

wherein $B = \int q_B(\lambda) \cdot S(\lambda) d\lambda \cdot t_{exp}$;

wherein $q_R(\lambda)$, $q_G(\lambda)$ and $q_B(\lambda)$ are spectral sensitivities of a red, green, and blue color channel of the image sensor, $S(\lambda)$ is the emission spectrum of the light-emitting semiconductor component, $t_{exp}$ is an exposure time, and $\lambda$ designates a wavelength;

categorizing the light-emitting semiconductor component in a class from a group of classes which are characterized by different value ranges of at least one parameter that depends on at least one of R, G, or B;

selecting the light-emitting semiconductor component for use with one or more other light-emitting semiconductor components having a same class as the class of the light-emitting semiconductor component; and illuminating the light source.

11. The method according to claim 3, wherein the class in which the light-emitting semiconductor component is categorized is characterized by rg2 and bg2 values which correspond to corresponding rg2 and bg2 values of sunlight or of light according to a standard illuminant A or D or light of a Planckian emitter.

12. The method according to claim 4, wherein the class in which the light-emitting semiconductor component is categorized is characterized by rg3 and bg3 values which correspond to corresponding rg3 and bg3 values of sunlight or of light according to a standard illuminant A or D or light of a Planckian emitter.

13. The method of claim 1, wherein the light-emitting semiconductor component and the one or more other light-emitting semiconductor components having the same class are configured for use in an illuminating application of the image sensor.

14. A method for classifying a light-emitting semiconductor component for an image sensor application, wherein the light-emitting semiconductor component is configured as a light source for an image sensor, comprising:

providing the light-emitting semiconductor component comprising at least two light-emitting semiconductor chips;

determining at least one of R, G, or B of a light emitted during operation with an emission spectrum by the light-emitting semiconductor component;

wherein $R=\int q_R(\lambda) \cdot S(\lambda) d\lambda \cdot t_{exp}$;

wherein $G=\int q_G(\lambda) \cdot S(\lambda) d\lambda \cdot t_{exp}$;

wherein $B=\int q_B(\lambda) \cdot S(\lambda) d\lambda \cdot t_{exp}$;

wherein $q_R(\lambda)$, $q_G(\lambda)$ and $q_B(\lambda)$ are spectral sensitivities of a red, green, and blue color channel of the image sensor, $S(\lambda)$ is the emission spectrum of the light-emitting semiconductor component, $t_{exp}$ is an exposure time, and $\lambda$ designates a wavelength;

categorizing the light-emitting semiconductor component in a class from a group of classes which are characterized by different value ranges of at least one parameter that depends on at least one of R, G, or B;

sorting the light-emitting semiconductor component into a category from a group of categories; and selecting the light-emitting semiconductor component during illumination for use with one or more other light-emitting semiconductor components having a same class as the class of the light-emitting semiconductor component.

* * * * *